Figure 1:
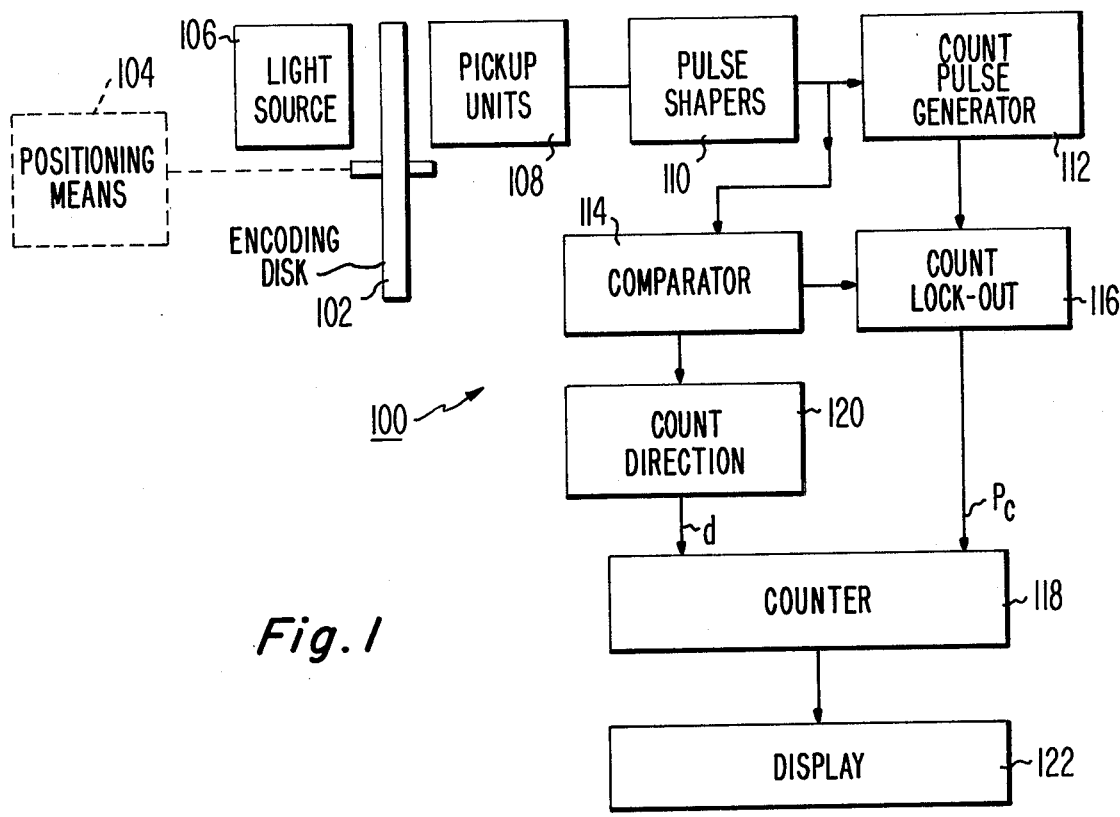

United States Patent [19]

Hartmann et al.

[11] 4,194,184
[45] Mar. 18, 1980

[54] BIDIRECTIONAL DIGITAL POSITION ENCODER

[75] Inventors: John C. Hartmann, Cedar Grove; Nicholas F. Maxemchuk, Mercerville, both of N.J.

[73] Assignee: RCA Corporation, New York, N.Y.

[21] Appl. No.: 788,036

[22] Filed: Apr. 15, 1977

[30] Foreign Application Priority Data

Apr. 30, 1976 [GB] United Kingdom ............... 17962/76

[51] Int. Cl.² ........................................... H03K 13/00
[52] U.S. Cl. ............................ 340/347 P; 340/347 M; 250/231 SE
[58] Field of Search ........................ 340/347 P, 347 M; 250/231 SE; 235/61.11 E, 454, 462

[56] References Cited
U.S. PATENT DOCUMENTS

| | | | |
|---|---|---|---|
| 3,634,853 | 1/1972 | Hedges | 340/347 P |
| 3,656,154 | 4/1972 | Ross et al. | 340/347 M |
| 3,702,471 | 11/1972 | Kennedy et al. | 340/347 M |
| 3,738,504 | 6/1973 | Vail et al. | 340/347 M |
| 3,967,271 | 6/1976 | Day | 340/347 P |
| 4,047,007 | 9/1977 | Dlugos et al. | 340/347 P |

Primary Examiner—Thomas J. Sloyan
Attorney, Agent, or Firm—Samuel Cohen; William Squire

[57] ABSTRACT

A digital rotary shaft position encoder includes a disk having a plurality of digitally encoded apertured tracks. The successive binary characters read from the tracks each have at least one 1 and comprise a repeating code having a different order of characters when read in one direction than when read in the other. The code is sensed to determine the direction of rotation of the shaft. The at least one 1 in each character is sensed to produce a clock pulse and these are counted to provide position information. The count is incremented or decremented in accordance with the direction information.

8 Claims, 10 Drawing Figures

I = INCREMENT
D = DECREMENT
S = SAME

BIDIRECTIONAL DIGITAL POSITION ENCODER

The present invention relates to position encoders which are bidirectional and of the incremental type.

Position indicators for use in machine-computer systems convert position information into electrical signals for computer control. The conversion may be performed by potentiometers, brush contacters, photoelectric devices, magnetic elements or induction systems. The electrical signals produced which are indicative of position, may be in the form of absolute codes, incremental counts, voltages or phase signals. In the systems producing incremental counts, the individual pulses of the pulse trains are counted and the accumulated count, when compared to a reference count, provides the position information. To provide direction information in an incremental system the well known 90° phase shift technique may be used. Another technique for providing direction information is disclosed in U.S. Pat. No. 3,371,338.

Figure 2:
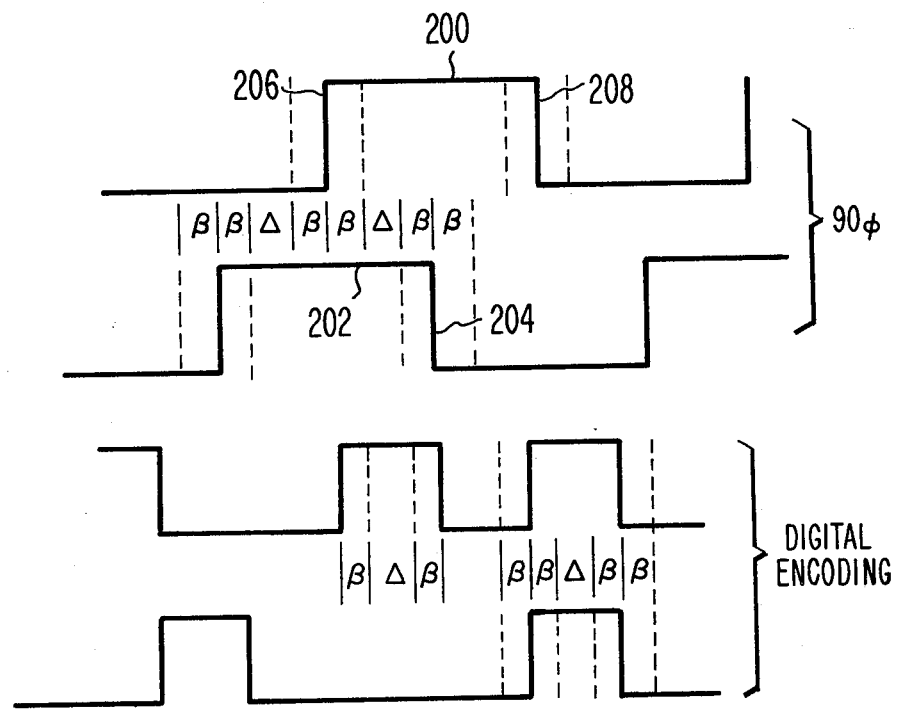
Figure 3A:
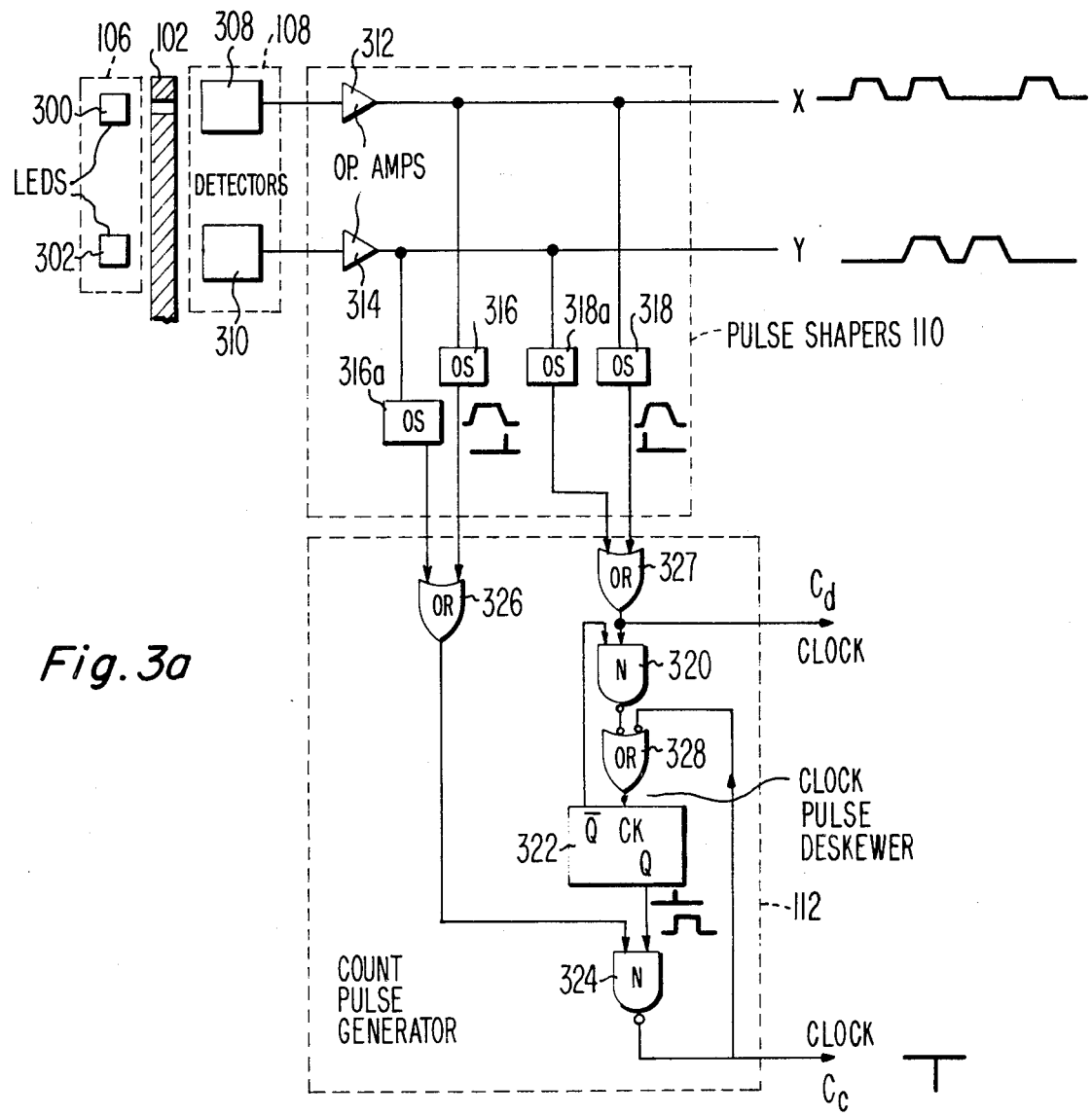
Figure 3B:
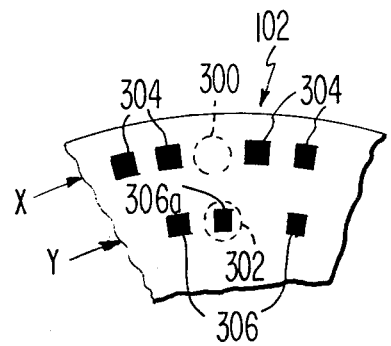
Figure 4:
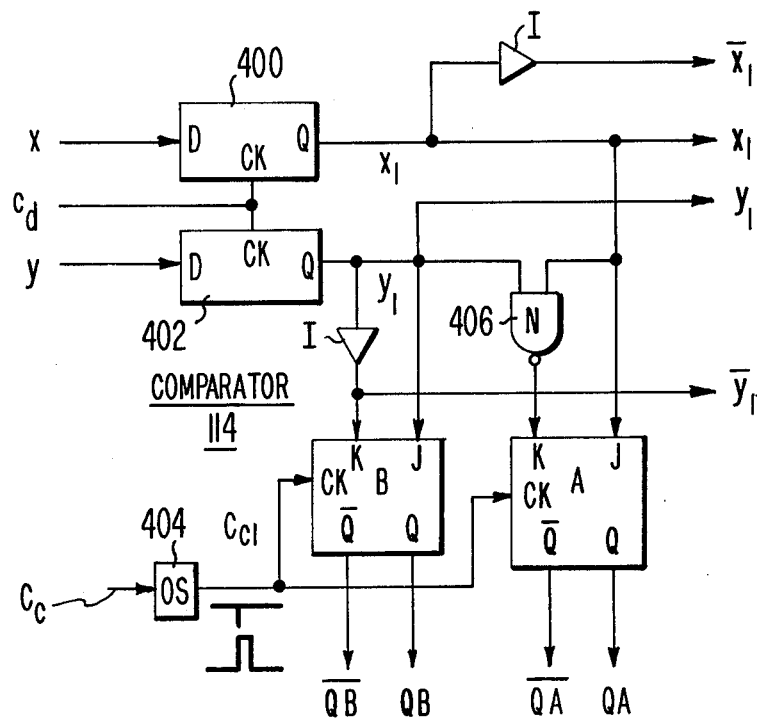
Figure 5:
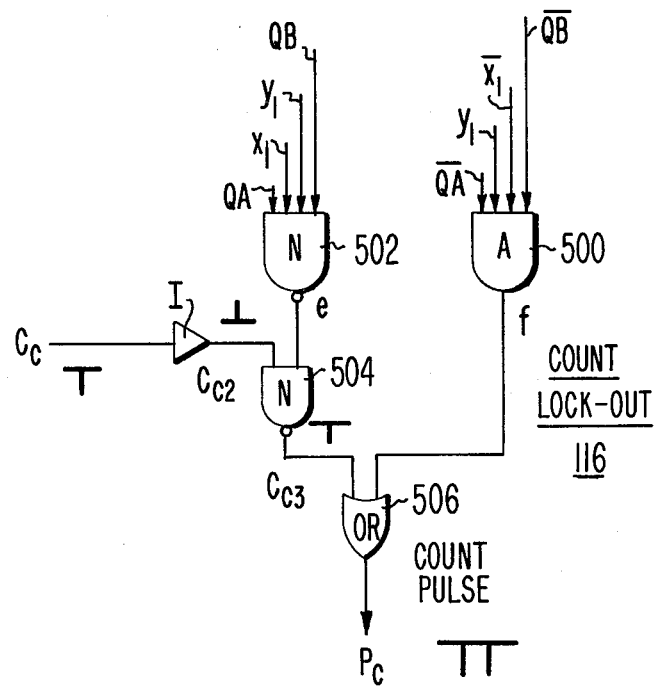
Figure 6:
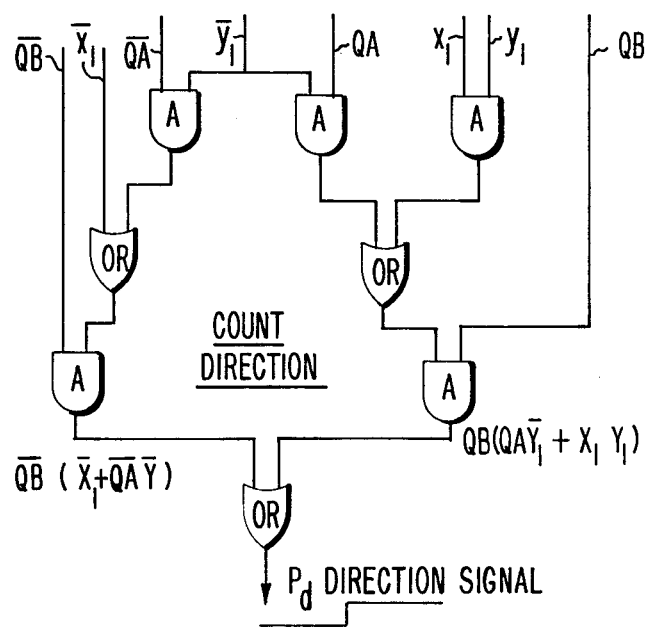
Figure 8A:
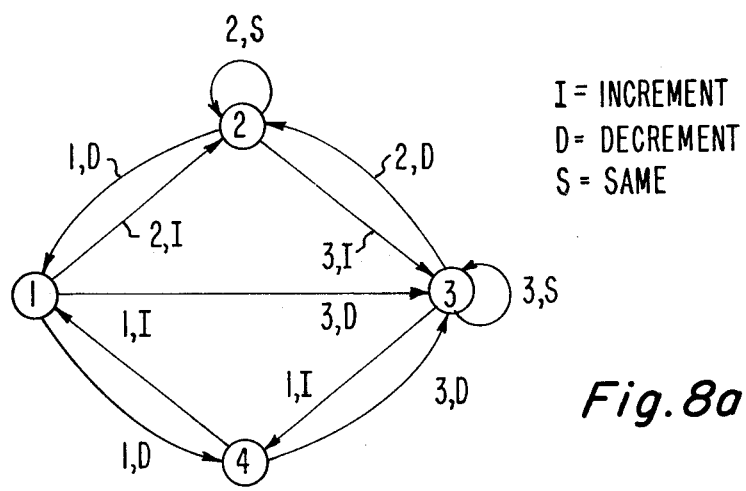
Figure 8B:
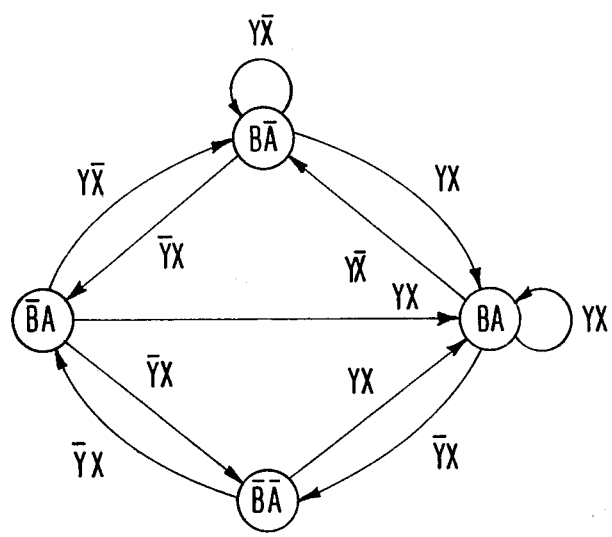
Figure 7:
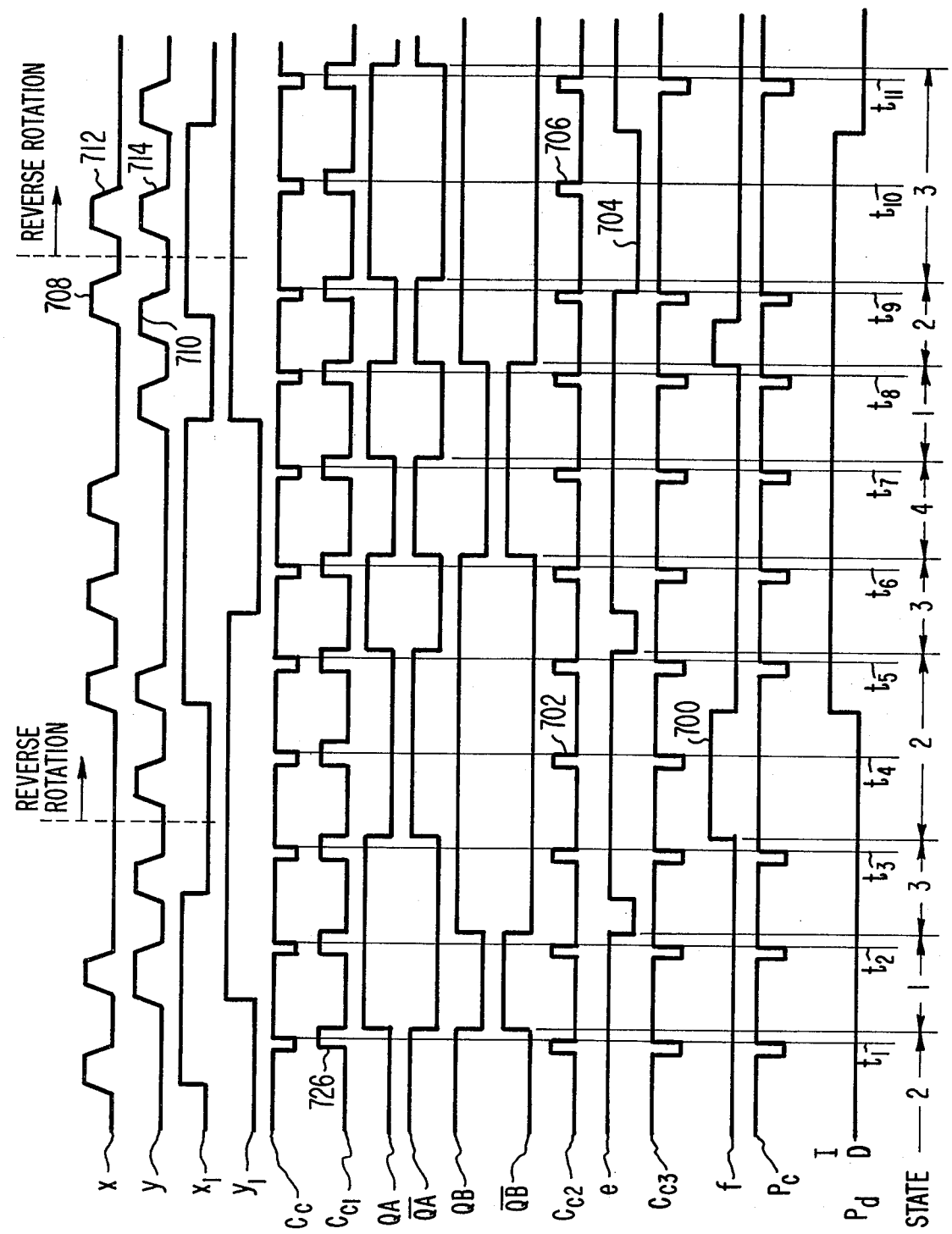

A digital encoder in accordance with the present invention includes moveable means having at least two tracks forming first and second periodic sequential codes for indicating first and second directions and a third periodic code which remains substantially unchanged in value in each cycle in all directions. Decoder means determine the direction and number of cycles traversed by the moveable means. In the Drawing:

FIG. 1 is a block diagram of a bidirectional incremental digital encoder embodying the present invention, FIG. 2 illustrates curves useful in comparing the present embodiment with 90° phase shift incremental encoders, FIG. 3a is a schematic illustration of a portion of the system of FIG. 1, FIG. 3b illustrates a fragmented enlarged elevational view of the encoding disc of FIG. 3a, FIG. 4 is a schematic illustration of the comparator portion of the system of FIG. 1, FIG. 5 is a schematic illustration of the count lockout portion of the system of FIG. 1, FIG. 6 is a schematic illustration of the count direction portion of the system of FIG. 1, FIG. 7 illustrates timing curves useful in explaining the principles of the present invention, and FIGS. 8a and 8b are diagrams useful in explaining the principles of the present invention.

In FIG. 1 bidirectional digital rotary shaft position encoding system 100 includes rotatable encoding disc 102 whose shaft is mechanically connected to a suitable positioning means 104 connected to an apparatus (not shown) whose rotary position is desired to be precisely measured. The positioning means 104 may include, for example, a Vickers Instruments, Inc. image splitting eyepiece. This is an optical device used with a microscope to measure small distances. The image splitting eyepiece comprises two parallel prism assemblies linked to a micrometer screw so that their angular relation to each other can be varied. When the prism faces are parallel, two images of the object, exactly superimposed and appearing as one are visible in the eyepiece. As the micrometer screw, for example, positioning means 104, is turned, the images separate and the two separate images are visible. Both images are of identical appearance and sharpness. The area between the images when separated or the overlap portion of the images when superimposed is distinct. Thus, the edge-to-edge setting of the two images can be accurately obtained. The screw is capable of a plurality of revolutions.

The system 100 of FIG. 1 includes an apertured digitally encoded disk 102 which is rotated by the positioning means 104. Disposed on one side of the disk 102 is a light source 106 which illuminates digitally encoded apertures in a plurality of encoded tracks formed on the disk 102. Photo-electric pick-up units 108 on the other side detect the incident light passed by the encoded apertures. Units' 108 signals are applied to pulse shapers 110 which form suitable pulses for processing in digital circuitry. The shaped pulses are applied to a count pulse generator 112 which generates a serial pulse train curve $C_c$, FIG. 7, whose pulses occur upon clockwise (CW) or counter clockwise (CCW) rotation of disk 102. The pulses do not occur at regularly spaced time intervals; i.e., they are asynchronous. They occur whenever the dial is moved. The pulses can have different widths and different intervals between pulses, depending on the operator. One feature of the code is that at least one binary 1 (permitting the passage of light) occurs in each code word or character. This allows asynchronous operation. A cycle is defined as the time period $t_1-t_2$, $t_2-t_3$, etc., FIG. 7, and will hereafter be designated as cycles $t_2$, $t_3$, etc. Thus, $t_2$ represents the period $t_1-t_2$, $t_3$ the period $t_2-t_3$ and so on. One code word occurs in each cycle. The shaped pulses from shapers 110 are also applied to comparator 114 which produces signals representing code word pulses presently produced in the current cycle and code word pulses produced during the immediately preceding cycle. Comparator 114 applies these signals over a first output lead to count lockout circuit 116 which cancels certain of the pulses produced by pulse generator 112. The cancelled pulses are those which represent the oscillation of disk 102 about the same encoded apertures, such as occurs when disk 102 is reversed in direction. They are cancelled to prevent registering false counts.

Count lock-out circuit 116 passes to the counter 118 those pulses produced by pulse generator 112 which represent an actual change of position of disk 102. Generator 112 provides an incremental count signal representing the angular position (and the number of revolutions) of the disk 102 from a reference position.

Comparator 114 also produces a second output signal. It is applied to count direction circuit 120. Count direction circuit 120 logically determines from the comparator 114 signals, which are in the form of a binary code, the direction of rotation of disk 102. When the disk rotates in a first direction, counter 118 increments, whereas when the disk 102 is rotated in the opposite direction, counter 118 decrements. The output of counter 118 is applied to a suitable display 122. Reset means (not shown) may reset the counter at any time to set a reference count, for example, zero, into the counter.

In various figures, the blocks labeled OS indicate one shot multivibrators, OR represent OR gates, N represent NAND gates, I, inverters and A, AND gates. There are two curves, one above the other, shown at the outputs of certain of the gates and flip-flop devices. They are intended to show the timing relationship of a previous signal to that of the output signal (the lower signal) of a device. These and other curves are shown also in the timing diagram, FIG. 7.

In FIG. 3a and 3b, encoding disk 102 is formed with two concentric circular arrays of encoded aperture tracks X and Y. The disk is opaque, the apertures clear. The upper track X is rotated in alignment with light emitting diode (LED) 300 while the apertures of lower track Y are simultaneously rotated in alignment with the LED 302. The LED's are shown in phantom in FIG. 3b and schematically in FIG. 3a. One aperture 304 and one aperture 306 may be aligned with a corresponding LED 300 and 302 during a given instant. For simplicity, the LED's 300 and 302 are shown in FIG. 3b disposed one above each other on the same radial line, but they may instead be radially displaced. In FIG. 3b, the LED 300 is aligned with an opaque area while LED 302 is aligned with aperture 306a.

A digital code is formed by the X and Y tracks as shown in Table 1.

TABLE 1

| X | → → → → → → | 1 | 1 | 0 | 1 | 1 | 0 | 1 | 1 | 0 | 1 | 1 | → → → → → → |
|---|---|---|---|---|---|---|---|---|---|---|---|---|---|
| Y | → → → → → → | 0 | 1 | 1 | 0 | 1 | 1 | 0 | 1 | 1 | 0 | 1 | → → → → → → |
|   | → → → → → → | A | B | C | D | E | F | G |   |   |   |   | → → → → → → |

As can be seen from Table 1, each character, such as A comprises a two bit code XY. The characters when read sequentially form a repeating code. From left-to-right, the sequential code is a repeating binary 123123, and from right-to-left, the sequential code is a repeating binary 321321.

Thus, the X–Y transitions in the forward (CW) direction are different from those in the reverse (CCW) direction. The system 100 determines the direction of movement of disk 102 by comparing the sequential transitions in the X-Y tracks in adjacent cycles. The characters are such that a pulse, as shown in curve $C_c$, is generated at each character position, that is, during each cycle $t_1$, $t_2$, $t_3$. Note that there is at least one aperture (one 1) per character A, B, C and so on. The code generated from the characters is incremental and is self-clocking in that there is always a pulse present in each cycle. Therefore, it does not matter at what speed the disk is rotated or whether or not the rotation is at a uniform speed.

Since the resolution obtainable with a given size encoding disk depends on the smallest resolvable element, apertures 304 and 306, the code of Table 1 provides a resolution which is double that possible with the 90° phase-shift direction determining system. FIG. 2 compares these two systems. $\beta$ represents the uncertainty region due to time delays in the circuitry or mechanical misalignment at the leading and trailing edges of each pulse. In making a 90° phase-shift determination pulses 200 and 202 need be detected. $\Delta$ is the minimum pulse duration (optical opening) required to obtain an output pulse count for each pulse or $2\Delta$ in this case ($\Delta$ for pulse 200 and $\Delta$ for pulse 202). Further, the falling edge 204 pulse 202 must follow the rising edge 206 of pulse 200 prior to the occurrence of the falling edge 208 pulse 200. This requires the detection of two edges having a total possible deviation of $4\beta$. Thus, the smallest element available for making a direction determination is $4\beta + 2\Delta$. In the present digital encoding system two out of three characters have but one binary 1. Only the presence of this bit in a given cycle is significant. Thus, these bits require only a $\Delta$ for detection. In the third character only one leading edge of the two bits of this character is used. Further the time coincidence of a $\Delta$ for both bits is required. Therefore only a single $\Delta$ element is used in this third character cycle. It is thus seen that the smallest element size is $2\beta + \Delta$ and occurs only in every third cycle when both X and Y pulses are present. Therefore, for a given physical space, twice as many elements with the present encoding system may be provided on an encoding disk as compared with the 90° phase-shift system.

Pick-up units 108 include a pair of photovoltaic cells 308 and 310, each aligned with a different track. The output of cells 308 and 310 are applied to respective operational amplifiers 312 and 314 which provide sharp rising and trailing edges to the pulse outputs of cells 308 and 310. Amplifier 312 produces an output wave x and operational amplifier 314 produces an output wave y.

In one particular application of the system, the positioning means 104 had one hundred equally spaced reference marks around its circular edge. The encoding disk was formed with a corresponding number of characters around its peripheral edge. In terms of the 1,2,3 code, there were thirty three 1,2,3 and one additional character so that the system produced an even number (100) of clock pulses per revolution. This one additional character code is represented by character C in Table 1 placed between character C and character D in Table 1. This is seen in FIG. 7, curves x and y cycles $t_6$ and $t_7$.

The x signals are applied to OS 316 and 318 while the y signals are applied to OS 316a and 318a. OS 316 and 316a provide a short duration pulses at the trailing edges of the curves x–y pulses. The outputs of OS 316 and 316a are applied to gate 326 to provide count pulses. The outputs of OS 318 and 318a are applied to gate 327 to provide clock signal curve $C_d$. The clock signal $C_d$ is applied to gate 320 with the $\overline{Q}$ output of triggerable flip-flop 322. The gate 320 output is applied with the output of gate 324 to gate 328 which forms the clock input of flip-flop 322. Gate 326 output and the Q output of flip-flop 322 are applied to gate 324 to form the clock signal curve $C_c$. The pulses of curve $C_c$ are eventually counted as count pulses. Gate 320, flip-flop 322 and gate 328 form a clock deskewer which ensures that only one clock pulse is generated in a given cycle. For example, in cycle $t_9$, FIG. 7, the y pulse 710 occurs before the x pulse 708. Ideally these should occur simultaneously but in practice, they may not, due to variations in manufacture of disk 102. A set pulse is produced by pulse 710 on the rising edge thereof which sets the flip-flop 322. The Q output of flip-flop 322 goes high and remains high for a time period sufficient to block out any subsequently occurring pulse generated by the rising edge of the x pulse 708. The first occurring falling edge at gate 324 produces a count pulse which resets flip-flop 322. This action prevents the generation of a second count pulse in that cycle.

Clock signal curve $C_d$ (not shown), comprises a series of pulses occurring on the leading edge of the x–y pulses, the $C_d$ pulses concurrently actuate the D flip-flop 400 and 402 of FIG. 4 each time a leading edge occurs. The curve x and y signals are respectively applied to the D inputs of of flip-flops 400 and 402. The Q outputs of flip-flops 400 and 402 are respectively shown by the $x_1$ and $y_1$ curve FIG. 7. Upon occurrence of $C_d$ clock pulse, the Q outputs of the D flip-flops follows the D inputs (x and y). For example, in cycle $t_1$, flip-flop 400 receives a clock pulse $C_d$ (leading edge of x) causing x, to go high because x is high. $X_1$ remains high until x is low when a $C_d$ pulse occurs, e.g., cycle $t_3$. In a similar vein, y is low in cycle $t_1$, therefore, y remains low. In cycle $t_2$, $y_1$ goes high because y is high at the time of the next pulse $C_d$ and remains high in each cycle until cycle $t_6$ when y is low. The Q outputs of flip-flops 400 and 402 thus form curves $x_1$ and $y_1$, respectively, providing state signals representing the high or low state of the x and y tracks in a given present cycle. In cycle $t_1$, x and $x_1$ are high, and y and $y_1$ are low, in cycle $t_2$, both x and y, and $x_1$ and $y_1$, are high.

The $y_1$ signal is applied to the j input of j–k flip-flop B. Inverted $y_1$ is applied to the k input. Signals $y_1$ and $x_1$ are applied to gate 406. Gate 406 output is applied to the k input of j–k flip-flops A. $X_1$ is applied to the j input of flip-flop A. Flip-flops A and B are clocked by the trailing edges of the pulses, curve $C_{c1}$. Curve $C_{c1}$ is produced by OS 404 in response to the input count pulses curve $C_c$. The trailing edges of the pulses of curve $C_{c1}$ are delayed with respect to the time of occurrence of the curve $C_c$ pulses. This delay is important in the operation of the present embodiment. This delay is sufficient such that, flip-flops A and B are triggered to change state, as necessary, by the trailing edges of $C_{c1}$ pulses at that point in time when the clock pulses $C_c$ have been passed through the entire system forming count pulses, curve $p_c$. As a result, the clock pulses of curve $C_c$ in a present cycle are compared by the lock-out circuit FIG. 5 and direction circuit, FIG. 6 with the flip-flops A and B outputs which represent the state of the X-Y code in the immediately preceding cycle. (Since the A and B flip-flops are triggered by the $C_{c1}$ pulses in the next cycle). During the interval of a negative pulse $C_c$ in any cycle, the A and B flip-flops are in a state corresponding to the X-Y character code in the preceding cycle. For example, during the interval of the $C_c$ pulse which occurs just prior to time $t_2$ (that is in the period $t_1$-$t_2$, or in the convention employed herein the $t_2$ cycle); QA=1, $\overline{QA}$=0 QB=0, $\overline{QB}$=1. These values of these four binary variables represent X=1 and Y=0. It may be observed X=1 and Y=0 (or $X\overline{Y}$) occurs during the period $t_0$-$t_1$, that is the preceding cyle $t_1$. These timing relationships are used in the count lock-out circuit of FIG. 5 and the direction determining circuit of FIG. 6.

The outputs of flip-flops A, B, 400 and 402 are applied to the count lock-out circuit, FIG. 5, which comprises an AND gate 500 and a NAND gate 502. The inputs of gate 502 are the QA and QB outputs of flip-flops A and B and the $x_1$ and $y_1$ signals from flip-flops 400 and 402. The inputs to the AND gate 500 are the $\overline{QA}$ and $\overline{QB}$ outputs of flip-flops A and B and the $y_1$ and $\overline{x}_1$ outputs of flip-flops 402 and 400, respectively. The output of gate 500 is shown by curve f and the output of gate 502 is shown by curve e. Curve e provides a lock-out signal, e.g., negative pulse 704, for certain of the counts when the counter is incrementing. Curve f provides a lock-out signal e.g., positive pulse 700, for certain of the counts when the counter is decrementing. The negative pulses of clock curve $C_c$ are inverted and applied with curve e as inputs to gate 504. The output of gate 504, curve $C_{c3}$ is a series of negative pulses, one for each cycle, except after the reversal of the encoding disk 102 when the counter switches from incrementing to decrementing. This reversal, e.g., occurs in cycle $t_{10}$. In this cycle no pulse is produced by gate 504, curve $C_{c3}$. The clock signal curve $C_{c2}$ provides a series of pulses each occurring in a separate cycle which are passed by gate 504 whenever curve e is high. When curve e goes low as at pulse 704 a count pulse, e.g., pulse 706, curve $C_{c3}$ is blocked out. When there is a reversal of rotation of disk 102 and the counter is going from decrement to increment, e.g., cycles $t_4$ and $t_5$, the gate 500 output curve f goes high, for example, cycle $t_4$, which blocks the processing of pulse 702, curve $C_{c2}$ into a count pulse, curve $P_c$.

It is thus apparent that when there is a reversal of the encoding disk 102 direction the count pulse produced by the same aperture(s) due to the reversal of rotation is ignored by the circuitry and not counted. The output curves $C_{c3}$ and f are applied to OR gate 506 to provide count pulse curve $P_c$. There is a pulse produced in each cycle curve $P_c$ except in that cycle immediately following the reversal of rotation of encoding disk 102.

In FIG. 6, the $x_1$, y, $\overline{x}_1$, $\overline{y}_1$, QA, $\overline{QA}$, QB, and $\overline{QB}$ signals are applied to a plurality of AND and OR gates to provide a count direction signal, curve $P_d$. The logic elements and the inputs thereto, FIG. 6, are self-explanatory. The operation of the count direction circuit FIG. 6, is readily understood by reference to the state diagrams of FIGS. 8a and 8b. In FIG. 8b the letters A, B, $\overline{A}$ and $\overline{B}$ refer to the QA and QB and $\overline{QA}$ and $\overline{QB}$ outputs of flip-flops A and B, of FIG. 4. The x-y designations of FIG. 8b refer to the $x_1$ and $y_1$ signals of FIG. 4. In FIG. 8a, the states 1, 2, 3 and 4 refer to the "four" encoded conditions of the X and Y tracks. Actually the 1, 2, 3 states correspond to the repeating code; the fourth state refers to the code $x\overline{y}$ which is due to the inserted C character. It (the fourth state) can be shown to be present if $\overline{y}x$ occurs after state 3(yx) or if $\overline{y}x$ occurs after state 1 ($\overline{y}x$). There can be an anomaly, discussed later, in $\overline{y}x$ to $\overline{y}x$ transition. State 1 is represented by the condition $\overline{y}x$; state 3 corresponds to the condition yx; state 2 corresponds to the condition $y\overline{x}$; and state 4 corresponds to the condition $\overline{y}x$. Each state, FIG. 8b, corresponds to a given combination of the outputs of the A and B flip-flops shown in FIG. 4. In FIG. 8a the count is decremented when the states sequentially transfer in the order 1 4 3 2 1 3 2 1. Conversely, the count increments if the states traverse in the order 1 2 3 4 1 2 3 1. It two successive states 2 or 3 occur, the counter does not increment or decrement. If two successive states 1 or 4 occur the count will increment or decrement due to added character C. Each state represents the state of the x-y tracks in the immediately preceding cycle, ignoring the delay of each state beyond each cycle by the time delay of curve $C_{c1}$ pulses. For example, state 4 cycle $t_7$ represents the character formed by the x-y tracks in cycle $t_6$.

The counter decrements when a signal, curve $p_d$, is low and increments when the signal goes high. The level changes upon each reversal in direction of rotation of the encoding disk 102 in the second cycle following the reversal of direction.

An anomaly is produced by the added character C which necessitates state 4. Should a reversal of direction occur immediately after the occurrence of this character a count error of one count results as no lock-out pulse is produced. However, this added character is optional, and is included only for illustration. It should be appreciated that the circuitry could be modified to provide a count lock-out should state 1 repeat and state 4 be eliminated when the additional character C is ommitted. Ths anomaly was produced by corresponding the present circuit with the Vicker's eyepiece which is calibrated in 100 units per revolution and providing 200 characters or pulse counts on the disk. By making the number of characters in a revolution a multiple of three this anomaly can be avoided and thus state 4 deleted.

The timing diagram of FIG. 7 illustrates the various shift in conditions that occur when the encoding disk 102 is rotated in different directions. It will be apparent that still other timing relationships may be developed when the encoding disk is reversed. While the preferred embodiment of FIG. 1 illustrates a rotating encoding disk it will be equally apparent to one skilled in the machine positioning art that linear (infinite radius) rather than rotating encoding tracks may be provided in accordance with a given implementation. While a two track code is illustrated, the invention is not to be construed as limited to a two track code. For example, a four track code wherein two tracks run perpendicular to each other can provide two dimensional positional information. An encoding plate may have a plurality of apertures formed in a grid of parallel tracks forming X-Y pairs each pair running parallel and perpendicular to the other. Four light emitting diodes and corresponding four detectors disposed on the opposite side of the tracks may be disposed in a movable probe. The probe may be attached to an apparatus following a particular motion. The multiple X-Y codes may be incremented in one coordinate and also in a second perpendicular coordinate in successive cycles. Suitable logic circuitry can be provided to provide the exact position information for the probe. Additional lock-out circuitry could be provided to blank out the signals of one coordinate while the probe is incremented in the other coordinate. The application of the apparatus may include situations other than the Vicker's eyepiece and may be used with any device having a linear or rotating displacement control means.

What is claimed is:

1. A bidirectional incremental digital encoder comprising:
    a member moveable in first and second directions,
    at least two digitally encoded tracks on the member, said tracks forming together first and second different sequential periodic digital codes, each code corresponding to a separate, different one of said directions and having a given encoded value in each period, said tracks forming together a third periodic code whose value remains substantially unchanged in each period, each period corresponding to a given position of said member, said first and second codes shifting in value in next adjacent periods,
    detecting means responsive to the sequence of shift in values of said first and second codes for producing a direction signal corresponding to the movement direction of said member and responsive to said third code for producing a count signal corresponding to the number of periods traversed by said member,
    count means responsive to said direction signal and said count signal for providing a member position indicating signal, and
    means responsive to the order in which the codes are sensed for causing said count means to disregard a second occurring count signal produced by the same code in succession.

2. The encoder of claim 1 further including count lock-out means responsive to said first, second and third codes for blocking said count signal for one period when said member switches between said first and second directions to prevent the generation of a false count.

3. The encoder of claim 1 wherein said detection means includes means for continuously comparing said first and second codes in two next adjacent cycles to produce said direction signal having first and second values corresponding to said first and second directions, said count means being responsive to said direction signal first and second values for incrementing or decrementing the count thereof in accordance with said direction signal values.

4. A position indicating system comprising, in combination:
    a code member formed with N binary coded tracks, where N is an integer equal to at least three, the code comprising successive different N bit characters formed by the tracks and forming a repeating sequential code in which the different characters are in one order when read in one direction and in a different order when read in the opposite direction, each N bit character having at least one 1, where N is an integer;
    N sensors adjacent the N tracks, respectively, for reading the successive characters from the tracks when there is relative movement between the tracks and sensors;
    means responsive to the signals produced by the sensors indicative of the at least one 1 per character, for producing a clock pulse for each character;
    means for counting said clock pulses; and
    means responsive to the order in which the characters are sensed for causing said means for counting to count in one of a decrementing or incrementing sense,
    said means responsive to the order in which the characters are sensed including memory means for successively storing successive ones of said characters and compare means for comparing the next sequentially produced character with said stored ones of said characters.

5. The position indicating system of claim 4 wherein said repeating code has at least M different values, said code comprising each said value repeating in said one and opposite orders, where M is an integer.

6. The position indicating system of claim 4 wherein said member is a disk and said tracks form circular concentric rings on said disc.

7. A positioning system comprising, in combination:
    a code wheel formed with N concentric tracks, each track having the same number M of binary signal manifestations, positioned along M radii, respectively, of said code wheel, said radii being spaced equal angles from one another, whereby there are present on said code wheel, M, N bit characters, which may be read, in succession, as the code wheel rotates; each said character having at least one 1, and said characters, when read sequentially in one direction comprising a repeating code having at least three different values, and when read sequentially in the opposite direction comprising a repeating code in which the successive N bit characters appear in a different order than when read in said one direction, where M is an integer and N is a substantially smaller integer;
    readout means comprising N sensors adjacent said N tracks for producing signals indicative of the N bit characters on the code wheel;

means for producing a clock signal in response to the at least one 1 signal appearing in each character; and means responsive to the repeating character sequence read from the track by the readout means for indicating the direction of rotation of the code wheel, said means responsive to the sequence in which the characters are read including memory means for successively storing successive ones of said characters and compare means for comparing the next sequentially produced character with said stored ones of said characters.

8. A position indicating system comprising, in combination:

a code member formed with N binary coded tracks, where N is an integer equal to at least three, the code comprising successive different N bit characters formed by the tracks and forming a repeating sequential code in which the different characters are in one order when read in one direction and in a different order when read in the opposite direction, each N bit character having at least one 1, where N is an integer;

N sensors adjacent the N tracks respectively, for reading the successive characters from the tracks when there is relative movement between the tracks and sensors;

means responsive to the signals produced by the sensors indicative of the at least one 1 per character, for producing a clock pulse for each character;

means for counting said clock pulses;

means responsive to the order in which the characters are sensed for causing said means for counting to count in one of a decrementing or incrementing sense; and means responsive to the order in which the characters are sensed for causing said means for counting to disregard the second pulse produced by the same character in succession.

* * * * *